(12) United States Patent
Hamilton et al.

(10) Patent No.: US 9,106,247 B2
(45) Date of Patent: Aug. 11, 2015

(54) ADC TESTING

(71) Applicant: ATEEDA LTD., Edinburgh (GB)

(72) Inventors: David Hamilton, Edinburgh (GB); Gordon Sharp, Edinburgh (GB)

(73) Assignee: ATEEDA LTD., Edinburgh (GB)

( * ) Notice: Subject to any disclaimer, the term of this patent is extended or adjusted under 35 U.S.C. 154(b) by 0 days.

(21) Appl. No.: 14/174,334

(22) Filed: Feb. 6, 2014

(65) Prior Publication Data

US 2014/0203954 A1     Jul. 24, 2014

Related U.S. Application Data

(62) Division of application No. 13/049,494, filed on Mar. 16, 2011, now Pat. No. 8,682,613.

(60) Provisional application No. 61/314,350, filed on Mar. 16, 2010.

(51) Int. Cl.
 | | |
 |---|---|
 | *H03M 1/10* | (2006.01) |
 | *G06F 17/18* | (2006.01) |
 | *H03M 1/12* | (2006.01) |

(52) U.S. Cl.
 CPC ............. *H03M 1/1071* (2013.01); *G06F 17/18* (2013.01); *H03M 1/109* (2013.01); *H03M 1/12* (2013.01)

(58) Field of Classification Search
 CPC ..... H03M 1/109; H03M 1/12; H03M 1/1071; G06F 17/18
 USPC .................................. 341/147, 120, 155, 144
 See application file for complete search history.

(56) References Cited

U.S. PATENT DOCUMENTS

| | | | | |
|---|---|---|---|---|
| 3,931,730 | A | * | 1/1976 | Dreitzler et al. ............. 73/35.14 |
| 4,897,650 | A | | 1/1990 | Shott, III et al. |
| 6,642,870 | B1 | | 11/2003 | Renovell et al. |
| 6,798,185 | B2 | * | 9/2004 | Tanghe et al. .............. 324/76.15 |
| 7,561,083 | B2 | * | 7/2009 | Anderson et al. ............. 341/120 |
| 7,583,945 | B2 | * | 9/2009 | McCarthy et al. ......... 455/249.1 |
| 8,319,509 | B1 | * | 11/2012 | Staver et al. ............. 324/750.01 |
| 2006/0256892 | A1 | | 11/2006 | Momtaz | |

OTHER PUBLICATIONS

European Search Report for Application No. EP 11 25 0312 dated Mar. 15, 2013.
Alegria, F. C. et al., *An ADC Histogram Test Based on Small-Amplitude Waves*, Measurement 31 (2002) 271-279.

* cited by examiner

*Primary Examiner* — Brian Young
(74) *Attorney, Agent, or Firm* — Alston & Bird LLP

(57) ABSTRACT

A histogram-based method for testing an electronic converter device, such as an analogue to digital converter, includes steps of defining at least one histogram hyperbin arranged to store hits for at least one subrange of output codes; applying an input test stimulus to an input of the device to test a subrange of output codes matched to the hyperbin; and accumulating the histogram. At least two hyperbins may be provided, each bin being arranged to store hits for at least one subrange of output codes, and the input test stimulus is applied to an input of the device to test a subrange of output codes matched to one of the hyperbins. Both hyperbins may be open while the histogram is being accumulated for any subrange of output codes. The method may further involve varying the input stimulus to test another subrange.

7 Claims, 15 Drawing Sheets

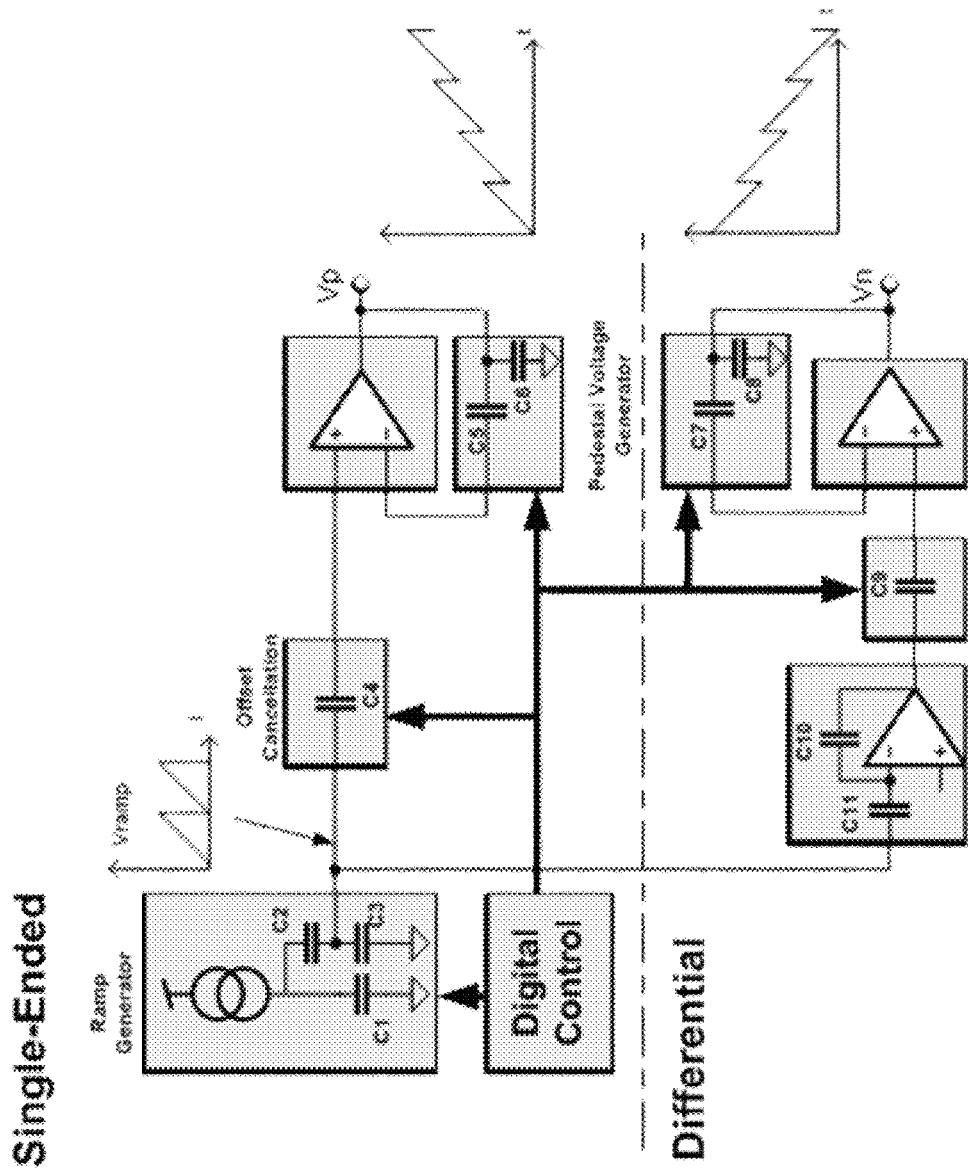

ADC TESTING

CROSS REFERENCE TO RELATED APPLICATIONS

The present application is a divisional of and claims priority to U.S. patent application Ser. No. 13/049,494, filed Mar. 16, 2011, which further claims the benefit of and priority to U.S. Provisional Patent Application No. 61/314,350, filed on Mar. 16, 2010, the entire disclosure of both of which are hereby incorporated herein by reference in their entirety.

FIELD OF THE INVENTION

The present invention relates to a system and method for on-chip testing of an analogue to digital converter (ADC).

BACKGROUND OF THE INVENTION

A common method for testing high resolution ADCs employs a histogram whereby an input stimulus is applied to the ADC and the resultant converted digital data output is recorded in bins relating to each voltage level applied at the input. The input is designed so that it has a known probability density function (PDF) of expected output converted values. The simplest such stimulus is a ramp which creates the same number of outputs for each code if the converter is perfectly linear, although any stimulus with equal probability of producing any given output code is also acceptable. The ramp may be repeated so the impact of noise is minimised and the number of 'hits' for a given code is increased. Any specification errors such as differential non-linearity (DNL) look like a change in the bin width, allowing it to catch more than its fair share of hits. This number of hits can subsequently be processed to extract a measure of the specification error, e.g. the DNL.

FIG. 1 illustrates a standard approach in off-chip automatic test equipment to test highly linear ADCs using the histogram method. A ramp of good linearity is created, which covers a small sub-range of the ADC. The ramp is placed on a series of increasing pedestal voltages. Provided the shape of the ramp is constant and unchanged when given each pedestal voltage, appropriate 'knitting together' of the series of sub-ranges can synthesis an equivalent full range PDF ADC response. As shown in FIG. 1, the effective linearity can be improved by a number of bits relating to the number of pedestals.

Whilst off-chip techniques for testing are useful, there is a drive towards having an on-chip solution. However, a problem with integrating a test device to implement the histogram method on-chip is that the PDF of the input signal must be precise and known. Typically, a ramp is used as it has a flat PDF, however for anything beyond 11 or 12 bit ADCs the ramp's own linearity is a limiting factor. Another problem is that a bin is required for each code giving 4000 bins for a 12 bit ADC and 64000 for a 16 bit. If these were all needed at the same instance too much silicon real estate would be required to allow a built in-self test.

U.S. Pat. No. 4,897,650 describes an integrated ADC histogram test method whereby the hardware is sequentially reconfigured to allow a histogram to be created in a segmented fashion one code at a time. The contents of each bin relate to the 'code widths'. After each bin is filled, the resources (two counters and a comparator) are released and made available for a following code.

U.S. Pat. No. 6,642,870 describes a similar method to test ADCs integrated on-chip using the histogram method but with sequential processing of bins to extract at least a functional characteristic of the converter, before releasing the resources for the next group of codes. In this case, instead of requiring many bins to accumulate a full histogram and carrying out sequential processing on a subset, the histogram bins are always reused by processing to determine at least a functional characteristic of the converter for each group of bins before moving onto the next group.

For high resolution converters a problem with the method of U.S. Pat. No. 6,642,870 is that it assumes each bin range is equal, but in practise, this is not the case, which can lead to errors. Hence, for example the performance can degrade as the supply rails are approached causing the ADC to suffer an INL error. Another problem not addressed by U.S. Pat. No. 4,897,650 or U.S. Pat. No. 6,642,870 is how to create an input signal which has sufficient integrity to test modern ADCs and has linearity requirements of 16 bits and beyond.

Despite the desirability of on-chip testing, including a test circuit on an ADC can add to the design complexity and size, which is a disadvantage. This is particularly true where the entire solution must be created in a relatively small area of on-chip silicon and a ramp method is used as the test stimulus. The rate of rise of the ramp is often too fast to give sufficient 'granularity' targeting sufficient hits per code because the input signal ramps too fast past each voltage corresponding to a code.

SUMMARY OF THE INVENTION

The present invention provides a method for testing ADCs. The method employs a pedestal based ramp, whereby a linear mini-input ramp is repeatedly applied to the input of the ADC until sufficient hits have been accumulated for each code in the target subrange in two hyperbins. The entire ADC output range of bins is compressed into the two sets of hyperbins (one odd, one even) which are used to direct an adaptive pedestal generator associated with the input ramp PDF generator. After a first set of data is captured, the offset (or pedestal) of the mini-ramp is increased to target a different subrange of the ADC. The use of 2n such pedestals effectively improves the linearity of the input stimulus (in terms of the evenness of its probability density function) by n bits. For example a 10 uV non-linearity in a 10 mV range is only 1 in 1000 which is 10 bits of linearity. However if it repeated 100 times to cover a 1V range, the nonlinearity is still 10 uV but now divided by a range of 1000 mV and so the effective linearity is now 1 in 100000 which is almost 18 bits of linearity.

The hyperbins may be permanently open, thereby ensuring that the series of increasing pedestal voltages provides a sufficiently accurate overlap to ensure good stitching of the output results. Given that it is necessary to generate the signals on-chip, it cannot be assumed that the ADC under test will be sufficiently accurately fabricated to predict a priori the thresholds for each input sub-range. It is therefore required to adaptively modify the input PDF ramp pedestal. The present invention readily facilitates this.

According to one aspect of the present invention, there is provided a histogram-based method for testing an electronic converter device, such as an analogue to digital converter, the method comprising: defining at least one histogram hyperbin arranged to store hits for at least one subrange of output codes; applying an input test stimulus to an input of the device to test a subrange of output codes matched to the hyperbin; and accumulating the histogram.

At least two hyperbins may be provided, each bin being arranged to store hits for at least one subrange of output codes, and the input test stimulus is applied to an input of the device to test a subrange of output codes matched to one of the hyperbins. Both hyperbins may be open while the histogram is being accumulated for any subrange of output codes.

The method may further involve varying the input stimulus to test another subrange.

The input test signal may be bigger than an input subrange corresponding to the hyperbin output subrange.

Applying the input test stimulus may involve defining a voltage ramp and after accumulating codes for the voltage ramp adding a pedestal voltage to the ramp to form another input stimulus to test another subrange, and repeating as required, preferably to cover the full input range. The pedestal voltage may be adaptively generated based on the hits accumulated in the hyperbins. The pedestal voltage may be set as a function of the number of hits in the hyperbin not matched to the input subrange.

The method may further involve storing data on the number of hits in a hyperbin for each subrange. The data stored may comprise at least one of: total number of hits in the hyperbin; the maximum number of hits in any bin; the minimum number of hits in any bin. The data is preferably stored on-chip with the circuit under test.

Test circuitry for applying the input stimulus and measuring the output may be integrated on chip with the device under test.

The hyperbins may be compressed. Compression of the hyperbins may be nonlinear. The beginning and end of the hyperbins may incorporate a wider range of converter codes then the middle range bins.

Data within the or each hyperbin may be used to determine the next input test stimulus.

The device under test may have a single-ended input range. The device under test may have a differential input range.

The method may involve estimating device noise or offset by examining the spread of hits within the hyperbins.

The method may be implemented using digital circuitry on-chip.

According to another aspect of the invention, there is provided a device for implementing the method of the preceding method. The device may be on the same chip as the circuit under test.

According to still another aspect of the invention, there is provided a method for sequentially incrementing a test stimulus voltage by successively sampling an output voltage; and applying the output voltage to a feedback capacitor to create a DC level change between the inverting input and output terminals on a feedback circuit, such as an op amp. A ramp may be used to control the amount by which the output voltage is to be incremented. A DAC may be used to control the amount by which the output voltage is incremented.

According to yet another aspect of the invention there is provided a circuit for applying a dc offset voltage to an input signal, the circuit comprising: unity gain buffer that has an inverting input, a non-inverting input and an output; and a feedback capacitor connected between the inverting input and output, wherein the feedback capacitor defines the dc offset level. The unity gain buffer may be a unity gain operational amplifier.

A sampling capacitor may be connected between the inverting output of the unity gain buffer and earth, so that it can be charged. One or more switches may be provided for switching the feedback capacitor and the sampling capacitor, so that the charged sampling capacitor defines the dc offset level.

According to yet another aspect of the invention there is provided a design tool for designing an on-chip test circuit for an ADC, the tool being adapted to capture a specification of a device under test, allow selection of a method of interconnection of the test circuit with the rest of the circuit, configure the way the test is run and output a design of the digital circuitry in HDL (e.g. Verilog or VHDL). The associated analog IP circuitry may be output as a schematic or more usefully as VerilogA, which is a description language for analog circuit models, or as a netlist and technology file, which gives a physical description of the on-chip analog circuitry, or as a combination of some or all of the above.

BRIEF DESCRIPTION OF THE DRAWINGS

Various aspects of the invention will now be described by way of example only and with reference to the accompanying drawings, of which:

FIG. 14 is a block diagram of a pedestal voltage generator.

DETAILED DESCRIPTION OF THE DRAWINGS

Figure 1:
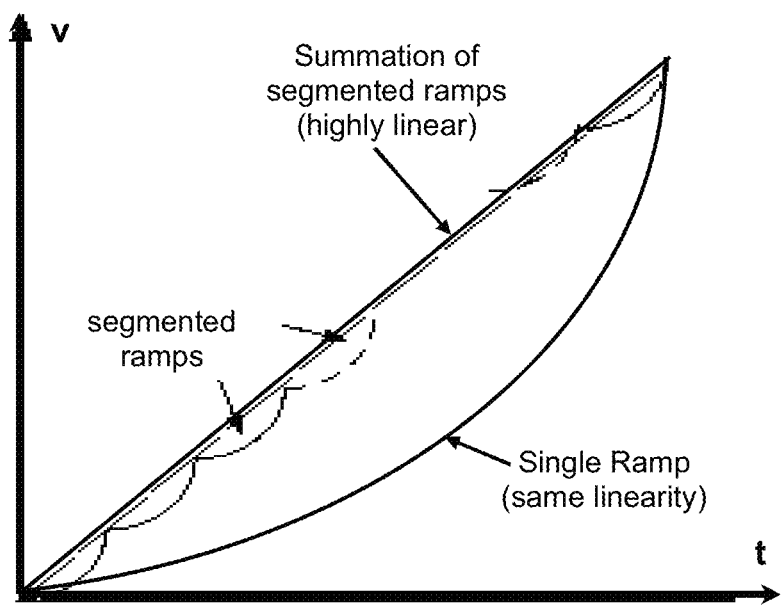
FIG. 1 illustrates a standard approach in off-chip automatic test equipment to test highly linear ADCs using the histogram method.
Figure 2:
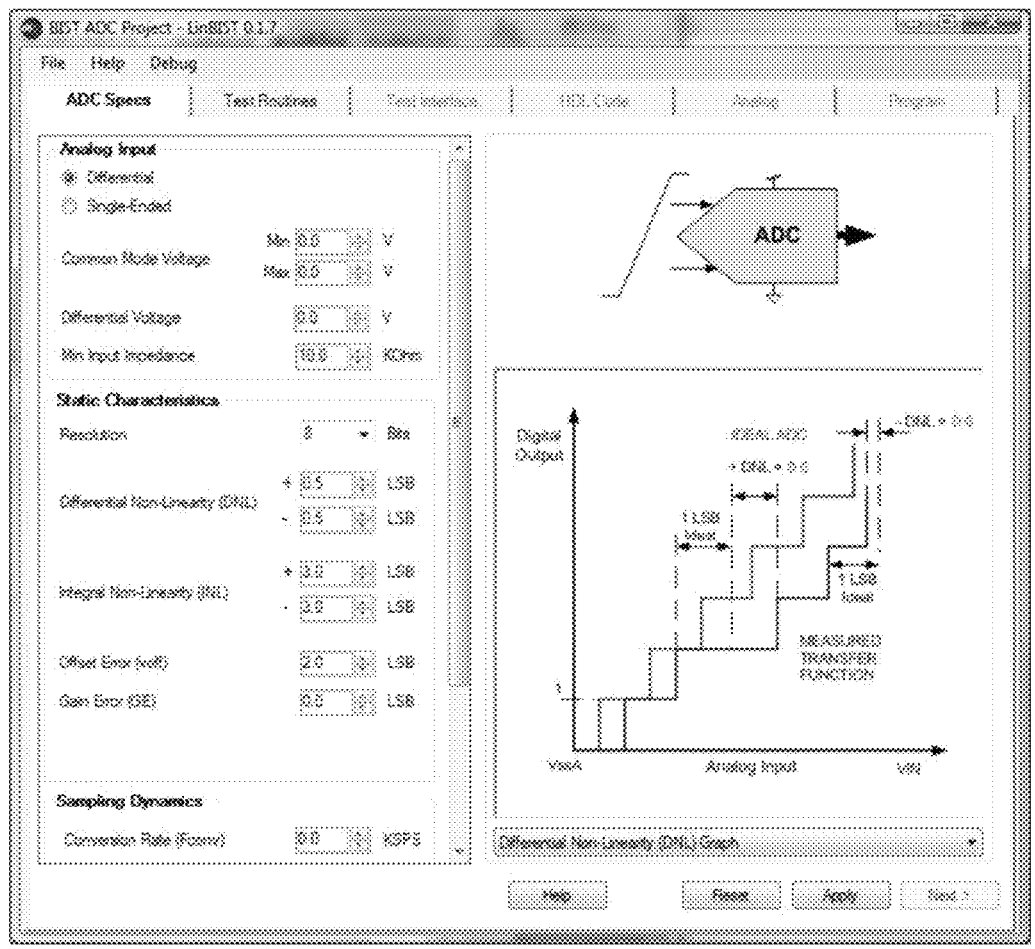
FIG. 2 is screen shot of an input page of a tool for designing a built-in-self test circuit for an ADC, in which a differential non-linearity (DNL) graph is shown.

To facilitate the provision of an on-chip test, a design tool is provided to simplify the design of a test circuit based on the ADC to be tested and the test requirements. FIG. 2 shows one screen of a computer implemented design tool for designing an on-chip test circuit. The tool captures the specification of the device (such as the ADC) under test, allows selection of the method of interconnection with the rest of the designer's circuit, configures the way the test is run and how the results are communicated, and outputs the design of the digital circuitry in HDL (e.g. Verilog or VHDL). The associated analog IP circuitry is output as a schematic or more usefully as VerilogA which is a description language for analog circuit models. All of the above is done simply by clicking buttons or entering numbers in fields alleviating the designer from a previously laborious and error prone task primarily carried out manually by an engineer highly skilled in digital design.

Figure 3:
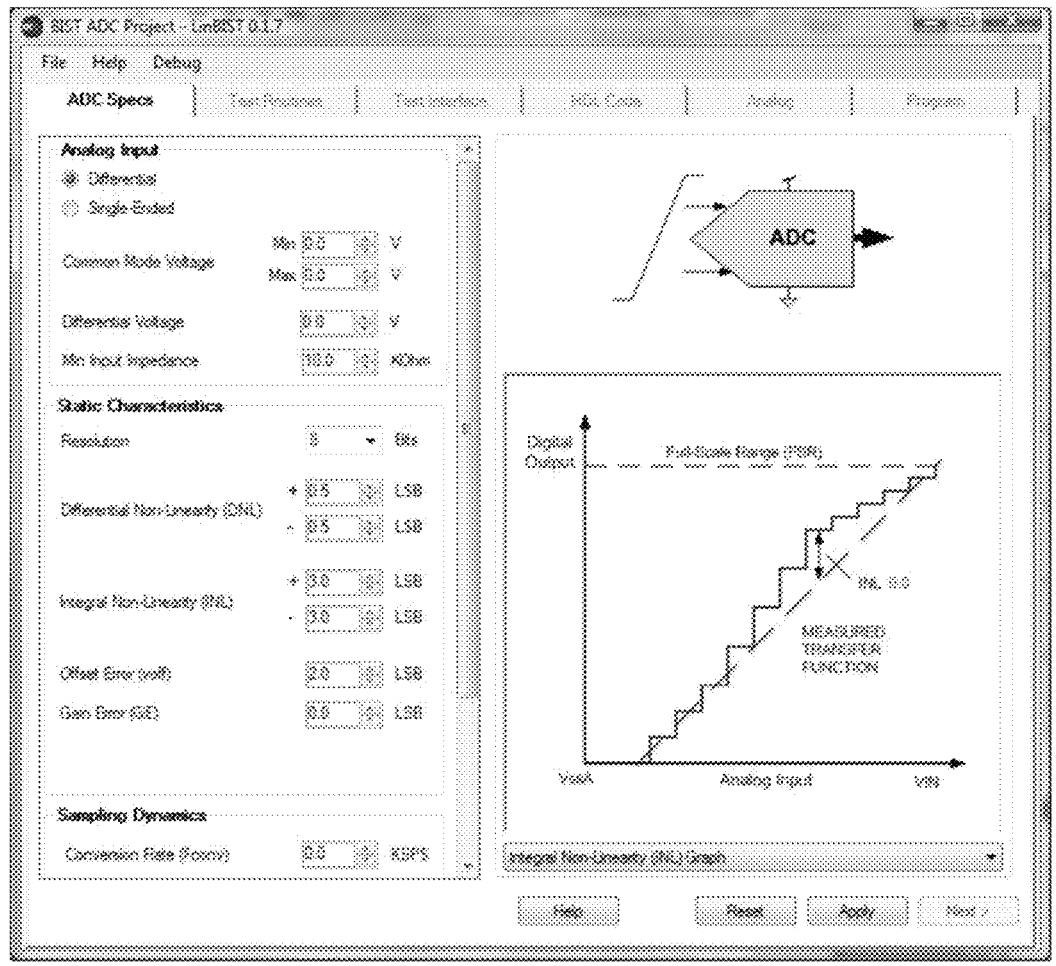
FIG. 3 is screen shot similar to that of FIG. 2, in which a integral non-linearity (INL) graph is shown.
Figure 4A:
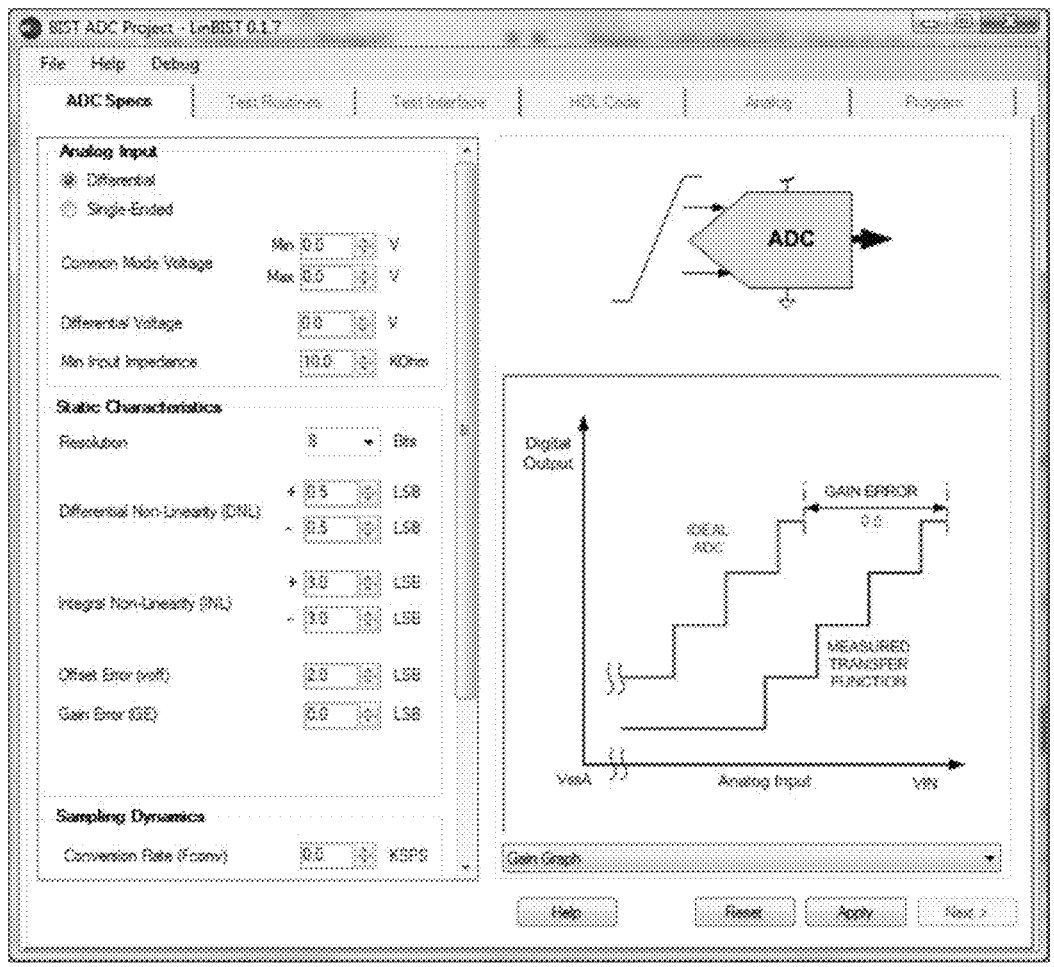
FIG. 4a is screen shot similar to that of FIG. 2, in which a gain graph is shown.
Figure 4B:
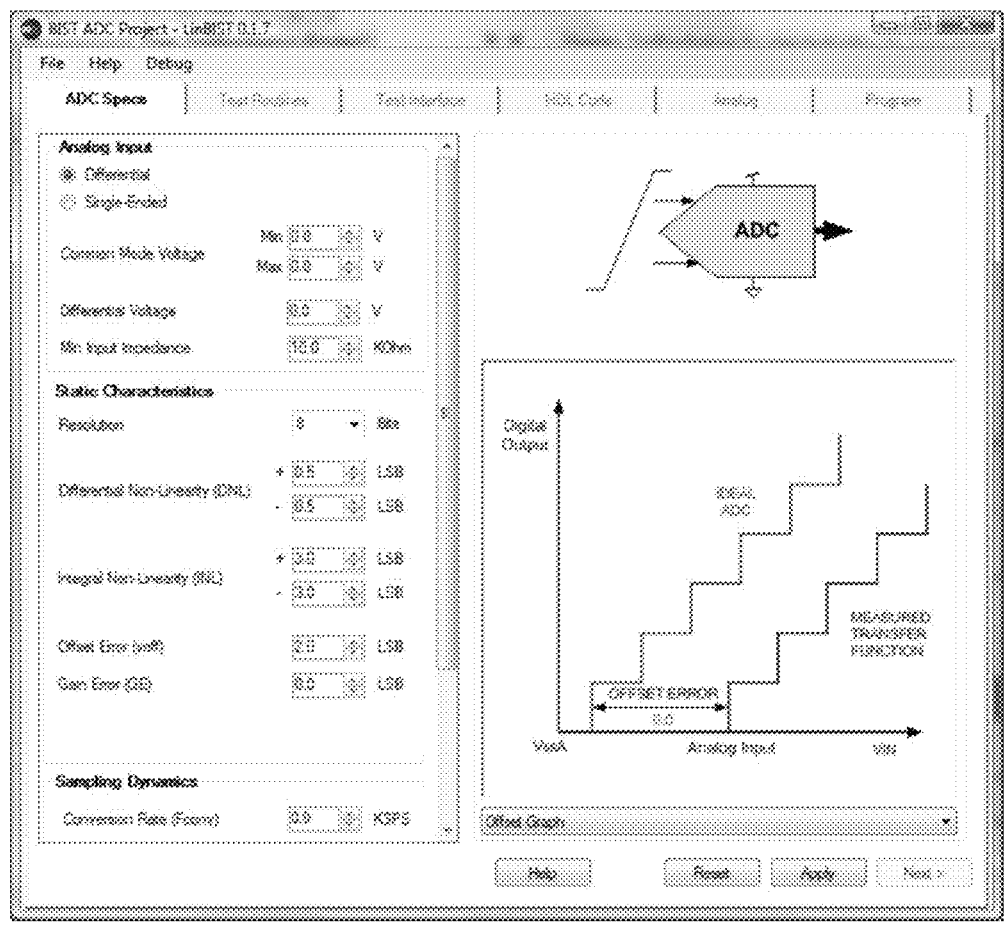
FIG. 4b is screen shot similar to that of FIG. 4a, in which the corresponding offset graph is shown.

Each tabbed window shows a step in the test design process. First the functional and other characteristics of the converter are entered. These can include ADC characteristics. By way of example this first screen prompts the designer to choose by pushbutton selection: common mode test voltage, input range, single ended or differential, input impedance, differential nonlinearity (allowing asymmetry for positive or negative), integral non-linearity, offset error, gain error, signal to noise ration, conversion time, clock rate. Other options could include effective number of bits (ENOB), total harmonic distortion (THD) or any relevant ADC feature need to carry out testing or set up the design. Graphical feedback of the characteristic being included is provided on screen. For example FIG. 2 shows a differential non-linearity (DNL) graph; FIG. 3 shows an integral non-linearity (INL) graph, and FIG. 4a shows a gain graph and shows an offset graph. The tool records all the choices made through the GUI by the designer.

Figure 5:
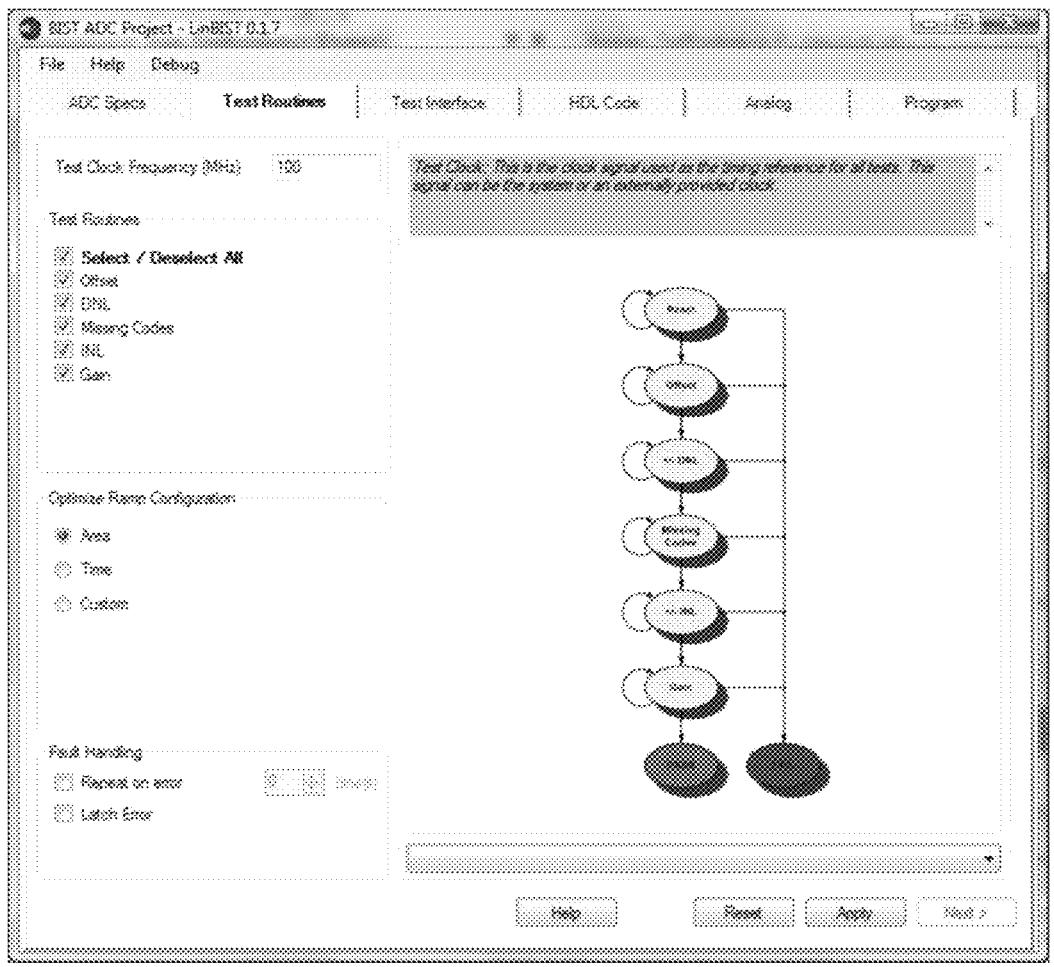
FIG. 5 is a screen shot of a page of the design tool for allowing selection of the characteristics that are to be tested.
Figure 6:
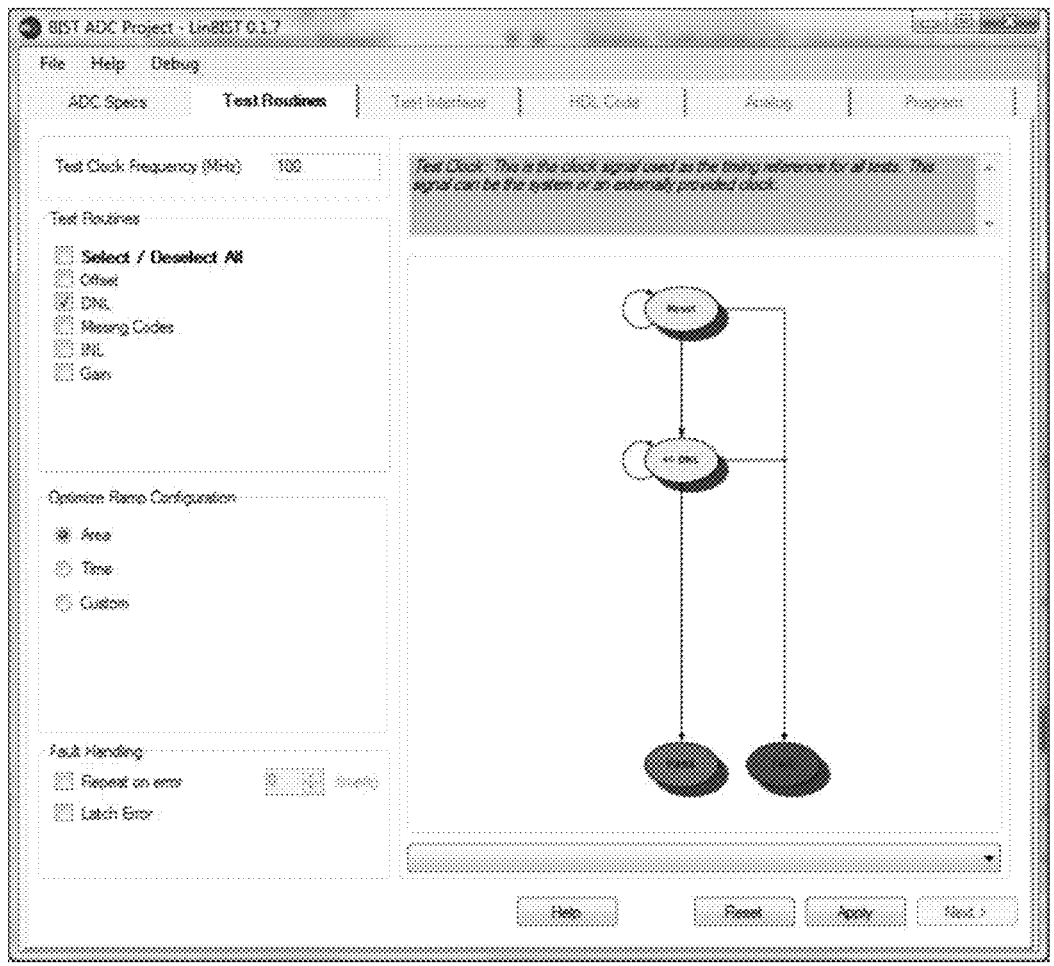
FIG. 6 is screen shot similar to that of FIG. 5, in which two user selections are made.

Once the device characteristics are entered, the tool presents a tabbed window that allows selection of the test routines, as shown in FIG. 5. This allows the designer to specify the tests that are to be implemented. Options include tests for assessing the ADC offset, DNL, missing codes, INL and gain. Each test is associated with a pre-written block of code that can be used later to generate the test circuit depending on the user inputs and selections. It may be that not all possible tests are included in order to reduce the overhead of silicon space required for the built in self-test (BIST) circuitry. Once again a graphical feedback is presented to the designer. Other options are included on this window related to details of how the designer wishes to handle a found fault, such as repeating the test a number of times or keeping the error. FIG. 6 shows how the graphical feedback changes when the user deselects some tests. In the example shown, the only test selected is for assessing the DNL.

Figure 7:
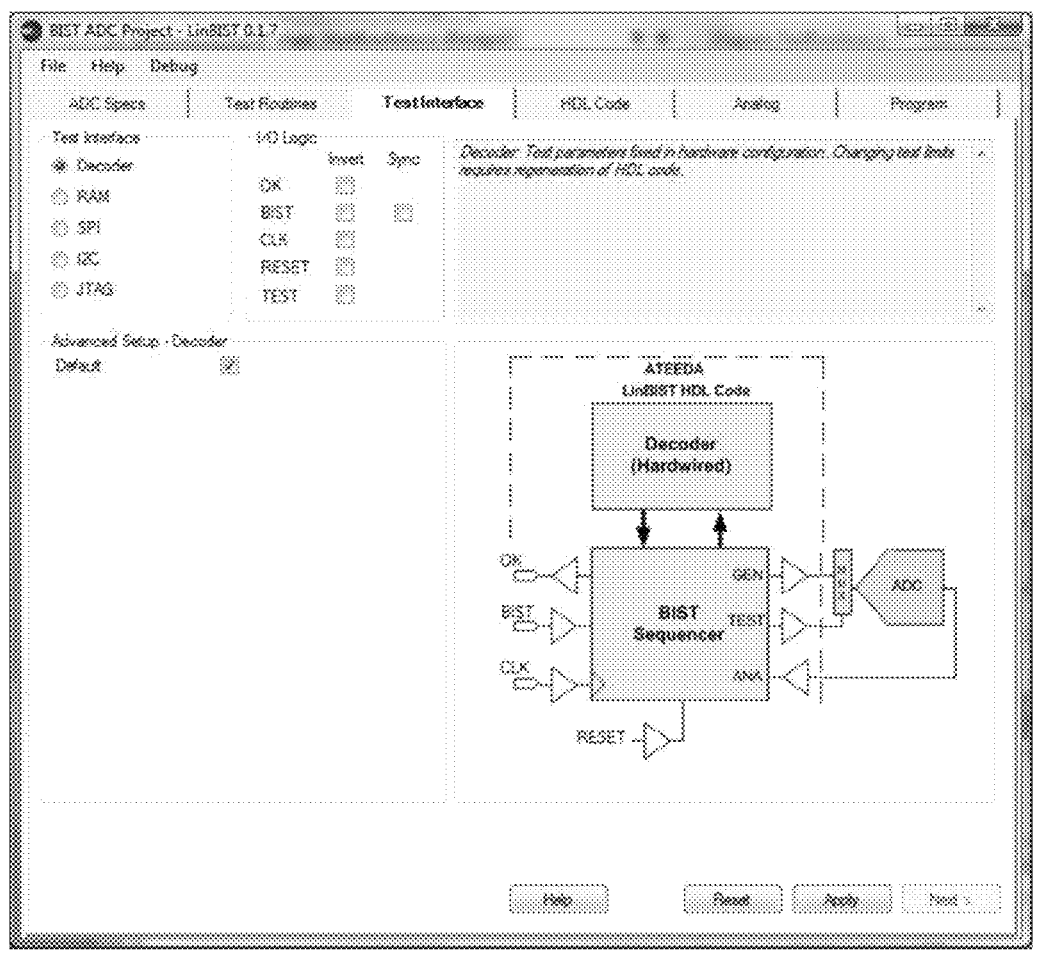
FIGS. 7 and 8 show two different examples of test interfaces that can be selected, Hardwired and JTag.
Figure 8:
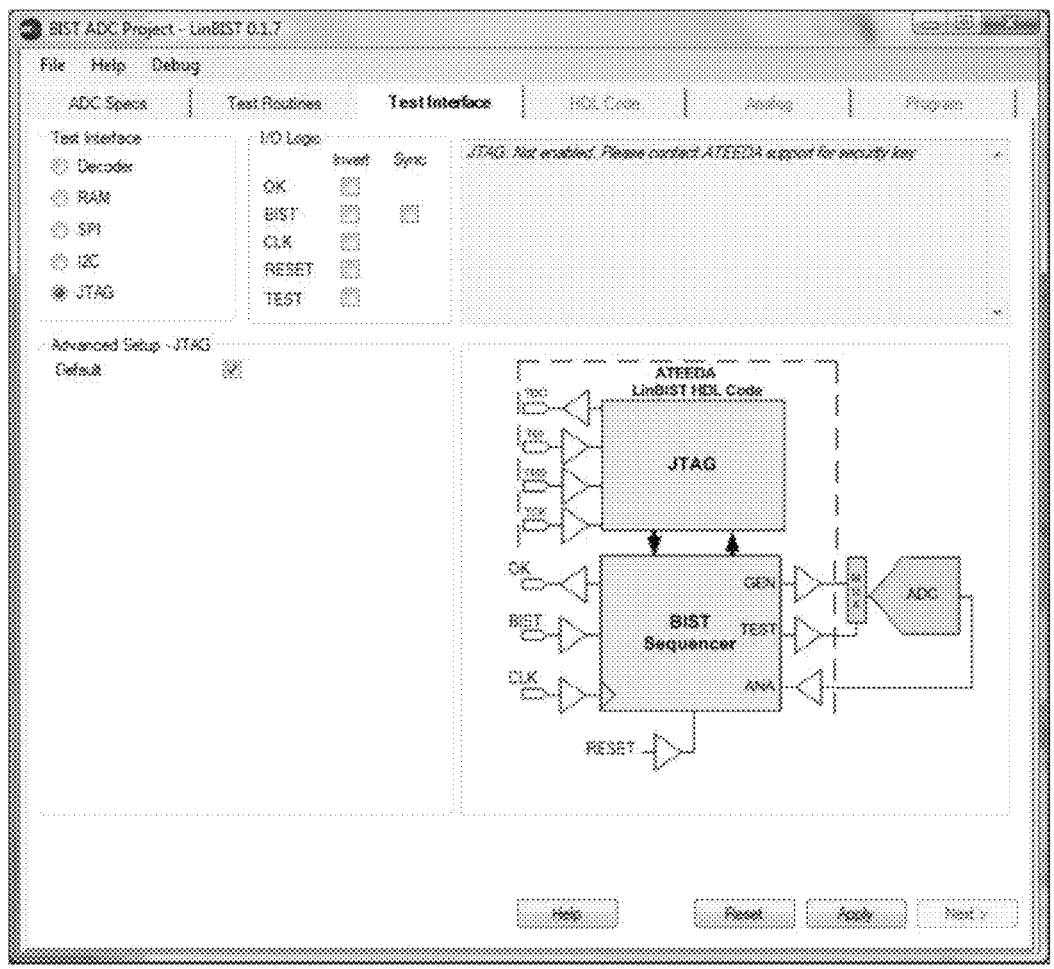

After the tests are selected, the tool allows an interface to be selected to connect the BIST structure to the rest of the designer's chip and digital circuitry. The designer can use the pushbutton interface to select from a standard range of interfaces including JTAG (joint test expert group interface), SPI (serial parallel interface), I2C (Inter Integrated circuit). It also allows the designer to choose whether the test should be hardwired in an on-chip decoder or made changeable at runtime by saving them in RAM. This feature can be useful in converter characterisation and debug of the test solution by changing the test limits dynamically and running many tests with differential limits. This screen allows the designer to choose the sense (positive or negative) of the interface lines going out of and coming into the BIST circuitry, once again by means of checking a selection box or button on the graphical user interface (GUI). FIGS. 7 and 8 show two different examples of test interface that can be selected, Hardwired and JTag but others are included as mentioned.

Figure 9:
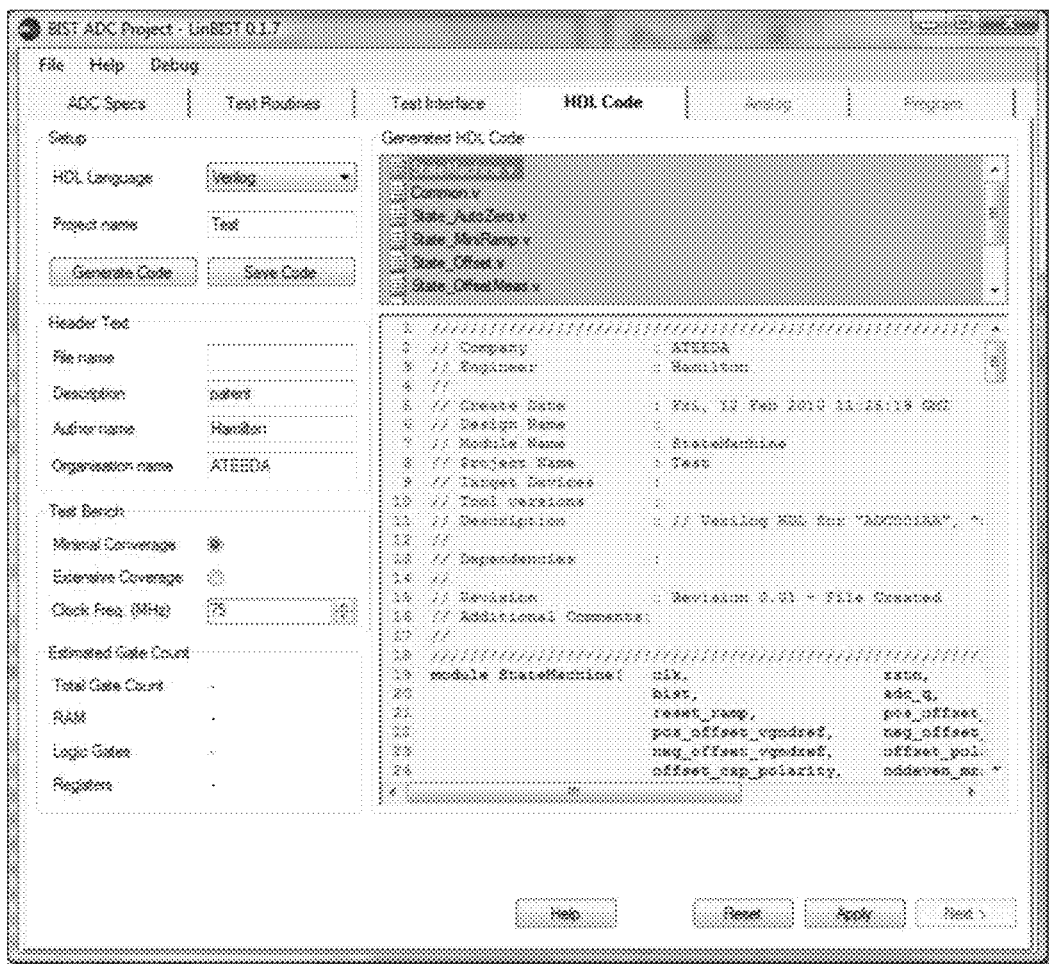
FIG. 9 is an interface for allowing the output code language to be selected.

The next stage is to create the HDL code again at the push of a button. FIG. 9 shows a screen, which allows selection of the output code language (e.g. Verilog or VHDL). If necessary, VerilogA output can be specified from here too. All the data entered in the preceding steps in the design process is now collated and the software tool automatically creates a suitable HDL description of the entire BIST digital hardware and (if desired) the analog description. At this stage the software can also estimate with high accuracy the number of digital gates (and/or registers) that will be required by the design. A simple extension can automatically use this information together with the technology node size (such as 90 nm silicon) to estimate the area on the chip that will be required by the BIST. It will be noted by one skilled in the art that the HDL code itself describing each of the blocks would normally be handcrafted each time by an engineer. In contrast, the tool of the present invention is adapted to automatically select prewritten blocks of code according to the selections made during the design process and adaptively adjust the size and numbers and detailed functioning of each block and sub-block to give the overall HDL output code. This code can be encrypted into a standard format so the detailed design can be kept confidential even though it can be simulated where necessary. Normally the HDL code is included by the designer in the digital part of the mixed signal chip design, it is then synthesised into gates and registers for autoplace and route and then follows the standard IC design and fabrication flow.

Figure 10:
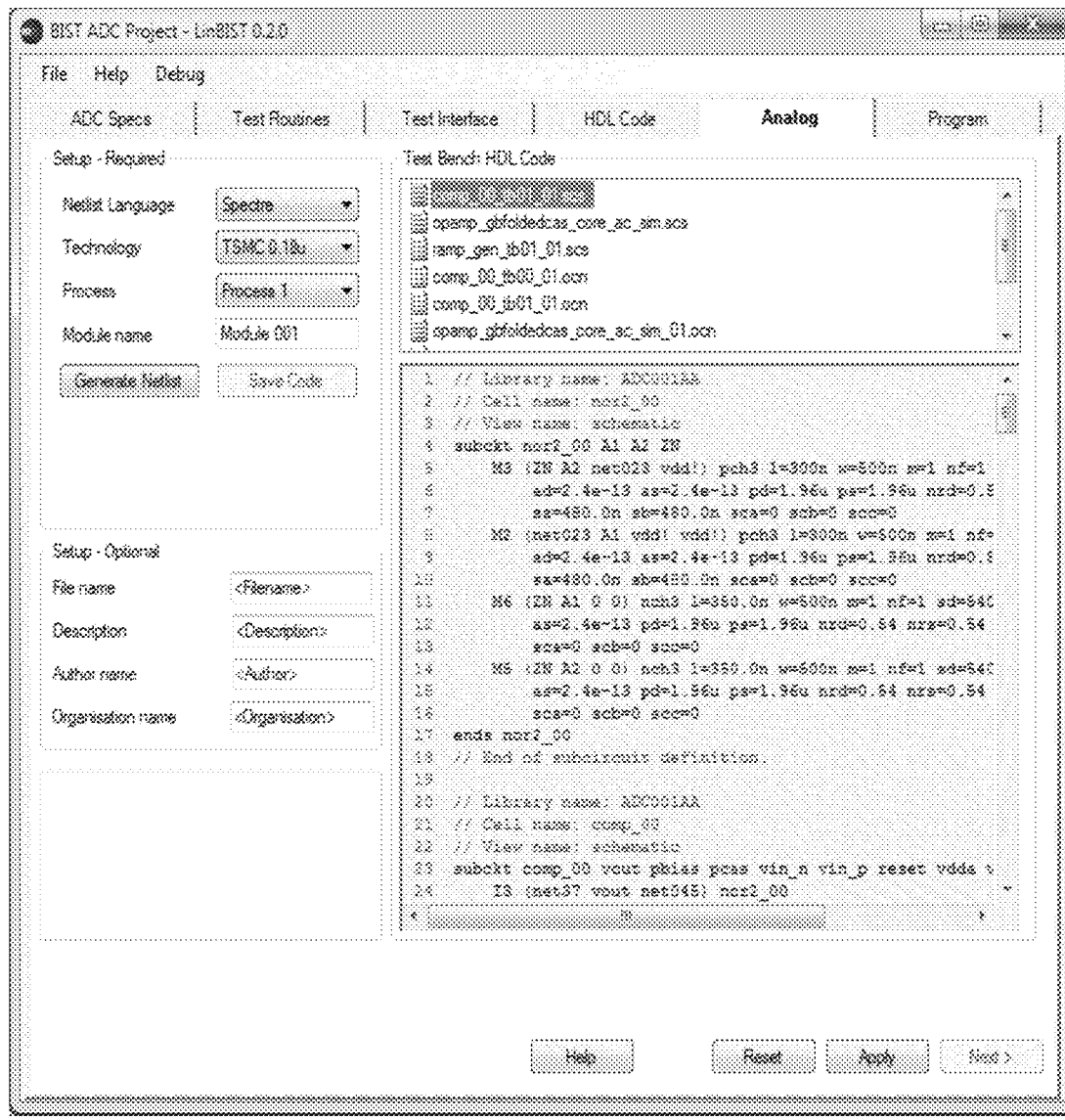
FIG. 10 shows a screen that facilitates automatic creation of test benches.

FIG. 10 shows a screen that facilitates automatic output of the analog IP in the form of netlists and analog test bench scripts. The analog IP netlist describes the analog circuitry used to generate the input test stimulus and can include automatic adjustment of certain parameters such as using larger drive transistors when the user specified a lower ADC input impedance. Normally this netlist would be inserted into the analog section of the users mixed signal design.

Figure 11:
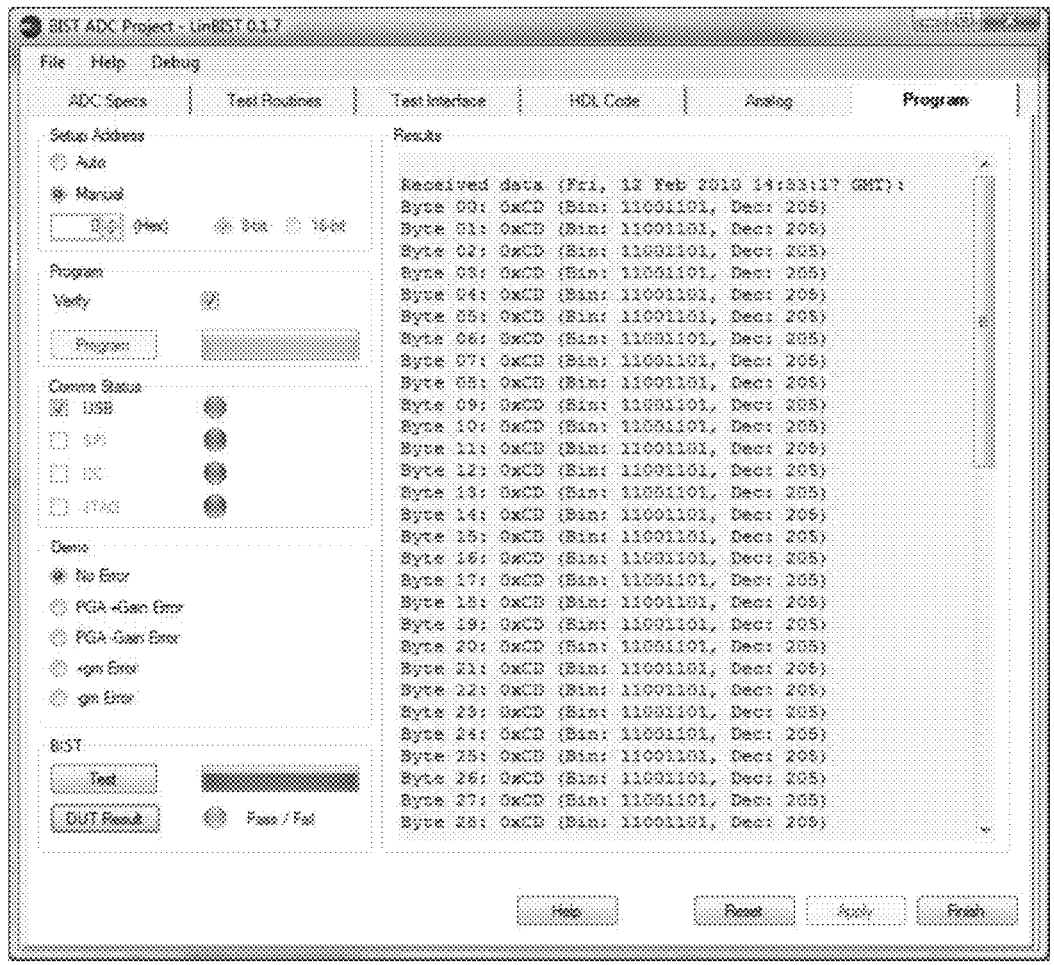
FIG. 11 highlights a feature which permits the digital circuitry to be downloaded and run immediately on an industry standard FPGA.

FIG. 11 highlights a feature which permits the digital circuitry to be downloaded and run immediately on an industry standard FPGA (field programmable gate array). It also permits programming of the way the BIST circuit operates by using a PC running the tool to communicate with the BIST hardware via the previously selected interface. This could be JTAG or SPI or I2C. This could be a simulation of the BIST in an FPGA or could be the BIST itself fabricated on-chip and now controllable/programmable via the external interface link.

Figure 12:
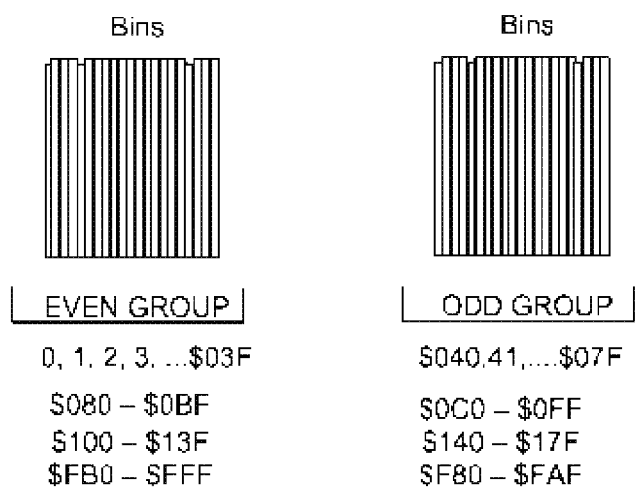
FIG. 12 shows two hyperbins for use in a test.
Figure 13:
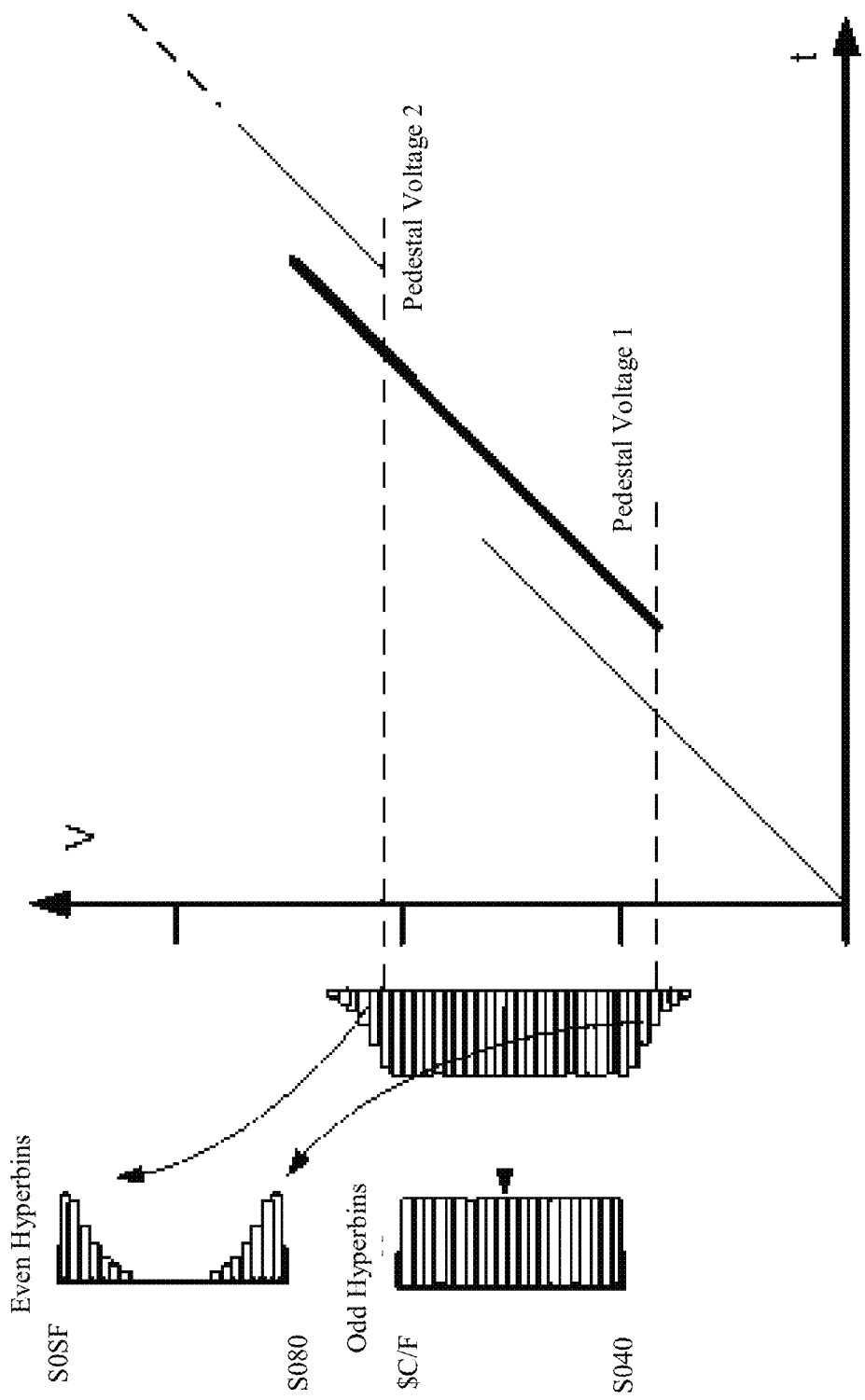
FIG. 13 shows segmented, overlapping test input ramps for testing an ADC using two permanently open hyperbins.

The test tool of the invention can employ various different tests, for example the histogram test described previously. In a preferred embodiment, the conventional histogram test is modified to reduce the processing requirements. To do this, rather than using a series of bins, each bin being associated with a different code, two hyperbins are used for storing all hits for a pre-determined range of codes, shown in FIG. 12, with the pedestal voltages being adaptively generated depending on the number of hits within the hyperbins. Hence, each hyperbin has an extra dimension allowing it to capture hits which would normally have fallen into distant bins. For example, consider a 12 bit ADC. In this case, two hyperbin sets of size 64 and order 32 are used, so that the bin range contains 64 bins, but each bin can capture hits intended for 32 different ADC outputs. There are 64 'odd' hyperbin elements and 64 'even' hyperbin elements. The odd and even hyperbins are always open to count all ADC output codes split as: (in hexadecimal)
$001-$03F, $081-0BF, $101-$13F, . . . $FB1-$FFF ODD hyperbin set
$0C0-$100, $140-$180, . . . $F80-$FB0 EVEN hyperbin set FIG. 13 shows how the pedestal voltage is adapted to ensure it is incremented with each subsegment ramp, ensuring it begins with a suitable overlap with the previous range by examining where in the hyperbins, the hits are occurring. Consider the case where a ramp is applied to the ADC such that it encompasses a sub-range of the ADC inputs values corresponding to an odd series of contiguous ADC output values. The ramp is designed to be bigger than the input subrange by some margin. This ensures that each ADC input value of the sub-range has equal probability of receiving the input signal even if the signal has noise throwing some inputs into nearby incorrect bins. The equal probability (i.e. flat probability density function) results in each count within that range being hit approximately the same number of times (save the impact of noise). In addition the ramp gives hits which are both higher than and lower than the target range. Provided the size of the ramp is restricted to less than twice the subrange, any hits from above the target range will fall into the adjacent even hyperbin set. Due to the rollover nature of the hyperbins, it is also true than any hits from below the target range will fall into the same even hyperbin set. No hits outside the target range fall within the odd hyperbin unless they are more than a full hyperbin width away. This is prohibited by control of the input signal and significant numbers doing so would indicate a gross ADC problem.

The input ramp is run a predetermined number of times to ensure sufficient numbers of hits within all the hyperbin elements to alleviate the error effect of any noise. The total number of hits in the target range is now added to a running total number of all the hits within the converter's input range. For each bin range some additional data is stored for later use in the test calculations, for example DNL and INL test calculations. This additional data includes but is not limited to the total hits in the bin range, the largest hits in any bin within the range and the smallest number of hits within the bin range. In addition a running grand total number of hits is recorded indicating the total number of hits covering all the codes in all the bin ranges tested so far. The next step is to use the contents of the hyperbins to determine where to start the next input pedestal voltage. Typically, this is set to be 50% below the top of the current hyperbin range so it can run with a sufficient overlap. This is achieved by examining the contents of both hyperbins to determine the middle of the range hit by the current ramp and identify what fraction of the ramp must be set to target the middle. A smaller overlap can be used provided it is enough to cover noise and tolerance error.

In the case where the input ramp signal is used to target the odd hyperbin, this is achieved by finding the centre of the current input ramp range as shown in FIG. 13. Whilst the odd hyperbin has been approximately equally filled with hits, the even bin has hits at either end but is nearly empty in the middle. For example suppose the lower 13 elements of the even hyperbin have some hits and the upper 24 also have hits. Thus the total number of hyperbin elements with hits is 64+13+24=101. The centre is therefore approximately the 50th element from the start of the hits captured in the bins owing to the ramp.

The lowest part of the ramp creates hits in the even hyperbin upper elements then runs into the odd hyperbin. So counting 24 bins in the upper hyper bin leaves 50-24=26 bins from the start of the odd hyperbin to find the middle of the previous ramp. However the middle of the odd hyperbin is 64/2=32nd element. So the new pedestal voltage must be found by ramping to slightly over halfway through its previous full range. (In fact it must ramp the equivalent of 32−26=6 more elements in the hyperbins). Given the full range of bins filled is around 100, this equates to just over 6% past the halfway mark of the ramp. With this knowledge, the new pedestal voltage is set by running the ramp and sampling and storing the new pedestal voltage at the correct time. The hyperbins are then cleared.

This process is repeated with the pedestal voltage tracking upwards through the ADC bin ranges until the full range has been covered. The input is thus controlled in such a way that it effectively steers the test input signal to cover the full range of the converter but in segments. An advantage of the hyperbin method is that since they are always open to catch all hits, there is no reconfiguring of the addresses of codes they capture and the pattern of filling within the bins can be used to steer the next input signal range adaptively. Once the process of collecting all the intermediate data from the hyperbins is completed for all ADC input subranges, the data is processed to extract functional characteristics of the ADC, such as the DNL, INL etc. This can be done on-chip using, for example, registers included in the BIST or off-chip using some form of processor, As an example, the DNL can be found by first taking the grand total number of hits found across all the codes in and dividing this by the total number of codes. This will be a 2 to the power n and is readily implemented as a simple shift right circuit. This total represents the expected number of hits for each every code if they were spread evenly as in an ideal ADC. For each targeted hyperbin range the minimum and maximum number of hits for any given code is stored earlier as the input signal was controlled to target different ranges. Each of these figures can now be checked to see whether any of the codes within a given range received too many or too few hits compared with the average number now known. For example if the average over the total range were 100 then a stored maximum of 150 hits would imply a DNL of +0.5 LSBs while a stored minimum of 50 would be −0.5 LSBs. The actual limit can have been programmed in earlier in the process to permit the limits to be varied. A simple pass or fail result can be issued at this stage. Alternatively more detailed characteristics can be achieved by varying the limits. This may allow a more accurate assessment of the limit at which performance breaks down.

The INL can also be found. Typically, the INL tolerance is significantly higher than allowed DNL specification tolerance. Accurate measures of the slopes between known codes points on the ADC output code characteristic are stored for each range. These effectively determine the shape of the ADC under test in detail, at least at the limits of each range of codes that was stored. The gain and offset have already been calculated as described above so simple arithmetic can be used to predict the expected position of each code. Also stored previously was the maximum size of a given code and minimum size. While primarily used for the much tighter DNL calculation as described, these can be included in the INL calculation limits too. Thus, provided each stored range point is within the allowed tolerance of expected locations for the INL, the ADC INL can be said to be within specification. It is obvious to one skilled in the art that where necessary variants of the above calculation such as calculating and/or storing the slope of each sub-range, or storing the maximum deviation from the said slope could be implemented to enhance or refine the calculation further.

Noise determination can be achieved by fixing a steady input voltage and examining the range of bins into which the ADC codes fall. The statistical nature will spread the ADC results due to the noise and the width will indicate the noise present. For Gaussian noise the hits will form a Gaussian spread across several bins and the standard deviation will indicate the root means square noise present. For low levels of noise below an LSB, a different method must be employed. In such cases all the hits will fall within a single bin or two adjacent bins for affixed input voltage. This is likely to be the case only for lower resolution converters where each LSB represents a sizeable step of perhaps a few millivolts. In such cases the ramp pedestal can be used to adjust the fixed voltage until the hits are approximately even spread across two adjacent bins. Incremental adjustments and repeated measurements of the ratio in adjacent bins is used until the ratio has changed to approximately 5/6 in one bin and 1/6 in the other. For a normal Gaussian noise distribution the voltage adjustment between these two points is one standard deviation also equivalent to the RMS noise in the signal.

The offset may be determined by reading the ADC output when a null voltage (zero or zero differential) is applied. This can be done by applying a fixed DC input signal to the ADC and recording sufficient hits to indicate the average voltage applied. An alternative approach is also feasible using a standard linear projection process between two measured points on the ADC characteristic can be used to estimate the offset, being the voltage above the origin the line intersect the y-axis at code equals zero. These points can be provided to the ADC input as constant dc input voltages from a reference voltage and a fraction of the reference voltage.

The gain may be determined by processing the intermediate results from the histograms together with a separate calibration of the ramp using the BIST, reference voltage and a comparator. In one embodiment of the invention, the offset is estimated as described above and the precise slope of the test ramp is calculated by ramping the test signal generator output through a lower and higher known reference voltage and timing the transition time. These lower and higher reference voltages may be derived directly by dividing down the reference voltage using a resistor or capacitor network, which have good matching characteristics. Note the comparator offset voltage has no effect on this measurement as it is included in both measures and is automatically cancelled by ramping from one to the other voltage.

Having established the slope of the ramp in mV/uS the number of samples per second aimed at each code in the ADC is defined. This should be as near constant across all codes as possible in the ideal case. In our case, since the ramp has exceptional linearity, this is indeed the case. This input signal (samples/second) per (code) is also known as a probability density function (pdf) being the likelihood that the input voltage will generate any particular ideal ADC output code value. In our case this function is extremely flat. This flat function is applied to the real ADC for a known period of time either as a single ramp or as repeated ramps and the histogram hyperbins are created for a given range of codes in a given period. Using the known ramp slope and a known number of bins within a hyperbin range the gain of the device can be calculated and expressed in mV/code.

As an example consider the situation where the ramp is found to ramp at 1 mV/uS. Take the case where the ADC is expected to have a gain of 1 code/mV (i.e. the o/p changes by 1 code count per millivolt change in the input). Suppose the clock rate of the converter is 1 sample/0.1 uS so the signal gives 10 samples targeting each code per uS. So we expect to be applying 10 input samples per code of the ADC in a single ramp and if we run 10 ramps we expect each bin in the hyperbin rage to have 10*10 hits=100 hits. If the actual number if 90 then the gain is 10% higher and if it 110 then the gain is 10% lower. In practise the calculation can be taken over a greater number of bins, for example over the entire input range of the ADC using the accumulated total mentioned earlier.

By using the input signal to steer the testing of the ADC to focus on different sub-ranges suing the hyperbins, and by keeping a grand total of the hits and other numbers as testing proceeds, there is an implicit statistical variation in the total number of hits per hyperbin range. That is to say for the case where the input test signal is controlled to be a repeated series of miniramps covering the range of say 64 to 127, then the precise number of hits within the range from a given number of ramps applied to the ADC input will not remain exactly the same between tests due to noise. It is true that this error due to noise will accumulate as each of these subranges is added to give a grand total number of hits covering the entire ADC. However, this is effectively a statistical addition of random numbers with zero mean. Thus even where the error amounts to as much as 0.1 LSBs RMS, and say 64 pedestals are employed, it can be shown that maximum error likely to be encountered is almost never 6.4 LSBs, the theoretical maximum, but in practise is less than 1.2 LSBs in >99.9% of cases due to the Gaussian spread of the summations of effectively random deviations. By combining two shorter runs and demanding both pass, confidence limits of 99.9999% can be achieved.

Variations and improvements on the invention can include the designation of certain bins within the hyperbin range to accumulate hits from additional adjacent codes. This effectively compresses further the number of actual bins required to scan a given range. For example the last bin in hyper bin range might collect all the hits from the ADC codes relating to the following 16 ADC codes. This can have utility in the precision of joining the results from a given targeted subrange with the next targeted subrange. Similarly more than one bin can be used to accumulate hits for several ADC codes. The bins may be non-linearly compressed. For example, bins at the edges of the hyperbins may be arranged to receive hits for multiple codes, whereas bins in the middle of the hyperbin may accept hits from single codes.

FIG. 14 shows a pedestal voltage generator for use in the test of the present invention. This has a digital controller that is connected to a current source that feeds a capacitor (C1). Connected across the capacitor C1 is a capacitor divider (C2, C3) to reduce the amplitude of the miniramp. Output from this part of the circuit is a voltage ramp. A further capacitor, C4 is connected on one side between the capacitors C2 and C3 and on the other side to the positive input of a unity gain buffer op amp. The capacitor C4 is used first to sample and then to eliminate an offset voltage of the buffer op amp.

Connected between the negative input of the buffer amp and its output is a capacitor, C5 which holds the current pedestal voltage. Not shown for the sake of simplicity and clarity in the figure are switches placed around C4, C5 to permit them to sample and hold offset and pedestal voltages. These switches are controllable by the digital controller. Connected between capacitor C5 and earth is a further capacitor C6. This can be positioned as shown in FIG. 14 or switched with the capacitor C5, so that the capacitors alternately act as a pedestal hold voltage capacitor when in the feedback position shown as C5, and a pedestal voltage sampling capacitor that can be charged to a required level prior to switching into the feedback position when in the sampling position shown as C6. C5 and C6 alternately swap locations and roles. Thus a single ended pedestal based ramp generator analog circuit is implemented.

The lower part of FIG. 14 shows how the ramp circuit can be readily extended to a differential variant of the same circuit. In this case, the pedestal capacitor is charged at the outset with a common mode voltage. The additional circuitry required for this differential variant comprises an inverter op amp stage, which is connected between the capacitor divider and the output pedestal buffer stage. Connected to the input of the inverter op amp is a capacitor C11. A further capacitor C12 is connected across the input terminal and the output. In this case the ramp is provided to the negative input of a differential input converter while the original signal from the upper buffer is applied to the non-inverting input of the converter. The selection of the pedestal capacitor voltage on which to start the ramp can be simply the specified common mode voltage at which the ADC requires to be tested, or it can be the minimum permitted voltage for the converter positive input and the maximum permitted voltage for the negative input, permitting both outputs to ramp through their full range from maximum negative differential input voltage through zero to maximum positive differential input voltage.

The current source and capacitor C1 are capable of generating a ramp, which due to real circuit limitations maintains only up to Na bits linearity over a restricted voltage range. When combined in a buffer with a multilevel (Nb bit) pedestal voltage generator, this achieves an equivalent ramp-based probability density function generator of Na+b bits linearity (eg a=12 b=6=>12+6=18 bits effective linearity measurement capability). This circuit architecture allows the test stimulus to be sequentially incremented by successively sampling the present output voltage and bootstrapping this voltage by placing it on a feedback capacitor to create a DC level change between the inverting input and output terminals on a feedback circuit such as an op amp. In this way, each subsequent pedestal voltage is found by capturing a DC voltage during the ramping time of the previous DC shifted ramp output. This could be the peak of the previous DC shifted ramp, or halfway up the previous DC shifted ramp or some other percentage of the way up the previous DC shifted ramp. The choice of the DC voltage or pedestal voltage may be programmable through the digital section of the BIST by changing the sampling time. Inherent errors caused by capacitance variation with voltage C(V) are overcome because each pedestal capacitor voltage is driven and set by the op amp output which is a near unity gain voltage source independent of capacitor value or ratios.

Each new pedestal voltage can be captured on a capacitor which can be used to form part of the voltage following level shift circuit. Since the voltage across the capacitor during the ramp does not change, no degradation of the circuit linearity occurs. Thus the pedestal voltage generator switches two identical capacitors for each output op amp. One provides a unity gain feedback path while the other is being charged. Then they switch roles and a new pedestal is formed. The op-amp offset voltage can also be removed by a calibration procedure permitting the hyperbins to create data which can later be processed accurately to determine the ADC offset voltage.

It will be clear to one skilled in the art that each new pedestal voltage could also be created by a DAC or a resistor ladder network across the supplies, or any other appropriate method of generating a reasonably controlled voltage source. Although that would require additional hardware it would still retain the benefits of immunity to variation of capacitance with DC voltage across it, C(V), provided it is filled from a voltage source.

The histogram method employs many ramps during the test. Variations, with time, which occur during the period of a full test in any of the ramps or other signals used for test purposes, such as non-stationary noise or interference or the effect of temperature changes on circuit components can be minimised by employing a suitable algorithm. For example the INL measurement can be improved by targeting the input signal at non-contiguous sections of the ADC. This is readily controlled using the digital control circuitry and ensures that no linearity error in the test stimulus is allowed to build up across the entire input range of the ADC which would degrade the INL measurement. For example a range with low ADC values may be targeted first, then a range with high ADC values, then a middle range, then a low range again and so on until the whole ADC input range has been covered. Note: changing ranges is simply a matter of changing the pedestal voltage, for example as described elsewhere in this invention and a full set of ramps is applied to each range before moving onto the next as before. The same data for each section is described as before. In addition a not must be kept of which ranges have so far been targeted.

The present invention uses a test algorithm that has been enhanced by exploiting as much digital circuitry in the algorithm as possible. The invention makes use of innovative analog circuit design to achieve extremely high effective-resolution when coupled with the digital circuitry. A software tool allows a designer to develop a test solution without detailed experience of one or more of the following: digital circuit design, analog circuit design, test engineering, thereby creating a full test solution simply by selecting options from a 'pushbutton' tool.

A skilled person will appreciate that variations of the disclosed arrangements are possible without departing from the invention. For example various extensions to the above algorithms could be added and implemented in the digital circuitry generated as HDL code from the tool. Accordingly the above description of the specific embodiment is made by way of example only and not for the purposes of limitation. It will be clear to the skilled person that minor modifications may be made without significant changes to the operation described.

The invention claimed is:

1. A method for sequentially incrementing a test stimulus voltage using a feedback circuit that has an inverting input, an output and a feedback capacitor connected between the inverting input and the output, the method comprising successively sampling an output voltage; applying the output voltage to the feedback capacitor to create a DC level change between the inverting input and output terminals on the feedback circuit; and applying the DC level change to the test stimulus voltage.

2. A method as claimed in claim 1 wherein the feedback circuit is an op amp.

3. A method as claimed in claim 1 wherein a ramp is used to control an amount by which the output voltage is to be incremented.

4. A method as claimed in claim 3 wherein a DAC is used to control the amount by which the output voltage is incremented.

5. A circuit for applying a DC offset level to an input signal, the circuit comprising:
a unity gain buffer that has an inverting input, a non-inverting input and an output;
a feedback capacitor connected between the inverting input and the output; and
a sampling capacitor connected between the output of the unity gain buffer and earth, so that it can be charged, wherein:
the feedback capacitor defines a DC offset level.

6. A circuit as claimed in claim 5 wherein the unity gain buffer is a unity gain operational amplifier.

7. A circuit as claimed in claim 5 comprising one or more switches for switching the feedback capacitor and the sampling capacitor, so that the charged sampling capacitor defines the DC offset level.

* * * * *